United States Patent [19]

Maruyama et al.

[11] Patent Number: 5,438,970
[45] Date of Patent: Aug. 8, 1995

[54] HIGH TENSION CORD CONNECTOR WITH MISFIRE DETECTING CAPACITOR FOR INTERNAL COMBUSTION ENGINE

[75] Inventors: Shigeru Maruyama; Yuichi Shimasaki; Masaki Kanehiro; Takuji Ishioka; Shigeki Baba; Takashi Hisaki, all of Saitama, Japan

[73] Assignee: Honda Giken Kogyo Kabushiki Kaisha, Tokyo, Japan

[21] Appl. No.: 53,691

[22] Filed: Apr. 29, 1993

[30] Foreign Application Priority Data

May 1, 1992 [JP] Japan ................. 4-139808

[51] Int. Cl.6 ............................................. F02P 11/00
[52] U.S. Cl. ......................................................... 123/630
[58] Field of Search ............... 123/630, 654, 647, 597, 123/643, 637, 417, 634, 635, 169 PH, 169 PA, 169 EL, 655, 608, 350; 324/328, 380, 399, 54, 393

[56] References Cited

U.S. PATENT DOCUMENTS

| | | | |
|---|---|---|---|
| 2,181,149 | 11/1939 | Peters et al. | 175/183 |
| 4,052,665 | 10/1977 | Gruenwald | 324/54 |
| 4,186,337 | 1/1980 | Volk et al. | 324/380 |
| 4,825,167 | 4/1989 | Batba | 324/399 |
| 4,886,029 | 12/1989 | Lill et al. | 123/630 |
| 5,017,874 | 5/1991 | Di Nunzio et al. | 324/378 |
| 5,111,790 | 5/1992 | Grandy | 123/654 |
| 5,175,501 | 12/1992 | Loewe et al. | 324/380 |
| 5,180,983 | 1/1993 | Murata et al. | 324/399 |
| 5,294,888 | 3/1994 | Miyata et al. | 324/393 |

FOREIGN PATENT DOCUMENTS 52-118135 10/1977 Japan.
3-326509 11/1991 Japan.

Primary Examiner—Raymond A. Nelli
Attorney, Agent, or Firm—Nikaido Marmelstein Murray & Oram

[57] ABSTRACT

A connector disposed at a distal end of a high tension cord having a conductive core therein for carrying an ignition voltage current for igniting air-fuel mixture in an internal combustion engine. A conductive connecting member is connected to the conductive core and a cover made of an insulation material is disposed therearound. A conductor is embedded in the insulation cover such that it locates around the conductive connecting member keeping a predetermined distance therefrom and sandwiching a portion of the insulation cover, whereby a capacitor, which constitutes a capacitive divider in cooperation with a second capacitor for detecting misfire through the ignition voltage, is formed between the conductive connecting member and the conductor. A ceramic insulator can be positioned between the conductor and the conductive connecting member section. The conductor can further be electrically shielded. The cover has a portion to be firmly secured with a mated portion of a device such as an inlet connector of an ignition distributor so as to be held there in position.

21 Claims, 4 Drawing Sheets

HIGH TENSION CORD CONNECTOR WITH MISFIRE DETECTING CAPACITOR FOR INTERNAL COMBUSTION ENGINE

BACKGROUND OF THE INVENTION

1. Field of the Invention

This invention relates to a technology for detecting misfire occurring during operation of a gasoline or other spark-ignition internal combustion engine and more particularly to a high tension cord connector with a capacitor for detecting misfire for an internal combustion engine.

2. Description of the Prior Art

As is well known, in gasoline and other types of internal combustion engines a high voltage produced by an ignition coil is distributed to spark plugs at the engine cylinders by an ignition distributor or the like through a high tension cord (high voltage cable). At each cylinder, the resulting electric discharge between the spark plug electrodes produces a spark which ignites an air-fuel mixture that has been drawn into the cylinder and compressed at the proper time, causing the mixture to burn explosively. In the course of this ignition-combustion process in the internal combustion engine, the mixture may for some reason occasionally fail to burn properly. This is referred to as a misfire. Misfires can result from causes in either the fuel system or the ignition system. Misfires caused by problems in the fuel system are the result of an overly lean or overly rich air-fuel mixture. A spark is produced between the spark plug electrodes but the air-fuel mixture does not ignite. Misfires caused by problems in the ignition system are the result of spark plug electrode fouling or ignition circuit malfunctions which prevent normal spark discharge.

The occurrence of misfire in the course of engine operation not only degrades engine performance but may degrade fuel consumption, or may cause after-firing of unburned gases in the exhaust system which can affect the exhaust emission control system and have other adverse effects. Moreover, since the occurrence of even a single misfire indicates a misadjustment or malfunction in the fuel or ignition system, prompt elimination of the problem is essential. Because of this, there is a strong need for development of a detector for detecting misfires as soon as they occur.

Figure 6:
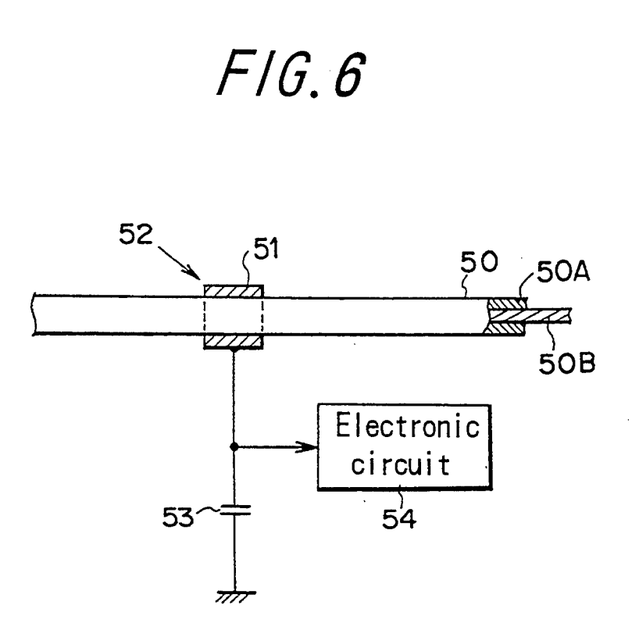
FIG. 6 is a schematic view showing the voltage detection means of a prior art misfire detector.

One type of misfire detector that has been proposed is the mis-spark detector described in Japanese Laid-open Patent Publication No. 52(1977)-118135. As shown in FIG. 6, the detector includes a conductor 51 wrapped around a portion of a high tension cord (high-voltage cable) 50 of the engine ignition system so as to constitute a detection capacitor 52 (a type of capacitance probe) in which the insulation cladding 50A of the high tension cord 50 serves as the dielectric. A voltage divider capacitor 53 is connected between the capacitor 52 and ground so that the ignition voltage (secondary voltage of the ignition coil) applied to the conductive core 50B of the high tension cord 50 induces a voltage across the terminals of the capacitor 52 owing to its static capacitance. The induced voltage is statically divided by the capacitor 52 and the capacitor 53, and the voltage across the terminals of the capacitor 53 (the divided voltage) is forwarded as a detection voltage to an electronic circuit 54 for processing and discrimination. The electronic circuit 54 discriminates the occurrence of misfires from the difference between the wave form of the ignition voltage at the time of normal spark discharge and that at the time of no spark discharge (mis-sparking). Among the different types of misfires, the detector thus detects misfires that occur when no spark discharge is produced owing to a problem in the ignition system.

Another detector for detecting misfire in internal combustion engines is disclosed in the present assignee's Japanese Patent Application No. 3(1991)-326509. In this detector, the ignition voltage is similarly detected through the capacitive divider, and misfire owing to causes in the fuel system is detected based on the fact that, even when spark discharge occurs, the wave form of the ignition voltage differs between the case where normal combustion occurs and the case where it does not.

In the conventional misfire detectors, as the means for detecting ignition voltage there is thus used such a "capacitance probe" constituted by wrapping a sheet or ribbon of conductor around the high tension cord of the ignition system so as to form the detection capacitor between the conductor and the core of the high tension cord via the insulation cladding of the high tension cord as the dielectric. However, the capacitance probe constituted in this manner has a major drawback that derives from the nature of the high tension cord of the ignition system. Because of its flexibility and elasticity, the high tension cord is highly susceptible to vibration. It is also easily affected by changes in the ambient humidity, wetting by leaking water, and fouling with oil, grime and the like. When a capacitor for use in detection is formed by wrapping a conductor ribbon around the cord, the static capacitance of the capacitor is apt to be changed from the proper value by shifting of the conductor caused by vibration as well as by changes in humidity, wetting with water and fouling with oil, grime and the like. Although some change in static capacitance can be tolerated if the capacitor is to be used only for checking the ignition voltage, even slight changes have to be avoided when it is used for misfire discrimination because such discrimination generally requires accurate detection not only of the ignition voltage but also of the ignition voltage wave form. The capacitance changes to which the prior art capacitance probe is susceptible degrade the detected voltage wave form and make it impossible to discriminate misfire with high reliability.

In actual practice, moreover, the flexibility and elasticity of the high tension cord make the work of attaching the conductor for forming the capacitor on the insulation cladding of the high tension cord and securing thereon difficult and troublesome. Maintenance of the so-formed capacitor is also troublesome.

On the other hand, when normal combustion does not occur and ions are therefore not produced at the gap between the spark plug electrodes, natural discharge between the electrodes does not proceed smoothly following insulation breakdown. Instead, the charge developed between the electrodes may flow through the ignition system in reverse. This produces changes in the voltage wave form detected by the detection capacitor or other voltage detection means of the misfire detector and makes it impossible to discriminate the presence/absence of misfire accurately.

Furthermore, the engine compartments of most modern cars are tightly packed with various devices, components and wiring. In providing the detection capacitor of a misfire detector, the conductor for detection constituting a part of the detection capacitor generally ends up being close to some other electrically conductive component. In this case, any change in the distance between the conductor for detection and the nearby conductive component will substantially change the capacitance of the detection capacitor. In addition, the detection capacitor will pick up noise from the nearby conductive component. Since any such change in capacitance or introduction of a noise component adversely affects the ignition voltage wave form detected by the detection capacitor, the detection accuracy is degraded.

SUMMARY OF THE INVENTION

This invention was accomplished in light of the foregoing circumstances and has as its basic object to provide a high tension cord connector with a misfire detecting capacitor for a spark-ignition internal combustion engine, which enables the static capacitance of the capacitance probe to be maintained constant, unaffected by mechanical vibration, humidity changes, water-wetting and the like, and also enables a high degree of freedom from the insulation degradation, thus ensuring accurate detection of even the voltage wave form, and which is also easy to install and maintain.

Another object of the invention is to provide a high tension cord connector with a misfire detecting capacitor for a spark-ignition internal combustion engine which prevents the detected voltage wave form from being changed by a current flowing through the ignition system in reverse owing to residual change between the spark plug electrodes at the time of misfire and which thus enables the presence/absence of misfire to be reliably discriminated from the detected voltage wave form.

Still another object of the invention is to provide a high tension cord connector with a misfire detecting capacitor for a spark-ignition internal combustion engine which prevents degradation of the accuracy of ignition voltage wave form detection owing to substantial change in the capacitance of the detection capacitor or to picked-up noise, even when the conductor for detection constituting a part of the detection capacitor is located in the vicinity of another electrically conductive member.

For realizing these objects, the present invention provides a connector disposed at a distal end of a high tension cord for an internal combustion engine, comprising, a first conductor made up of a conductive core of the high tension cord or a conductive member electrically connected to the conductive core of the high tension cord, a cover made of an insulation material and disposed around the first conductor, and a second conductor disposed at the cover in such a manner that it locates around the first conductor keeping a predetermined distance from therefrom such that a capacitor is formed.

BRIEF DESCRIPTION OF THE DRAWINGS

These and other objects and advantages of the invention will be more apparent from the following description and drawings, in which.

DETAILED DESCRIPTION OF THE PREFERRED EMBODIMENTS

Figure 1:
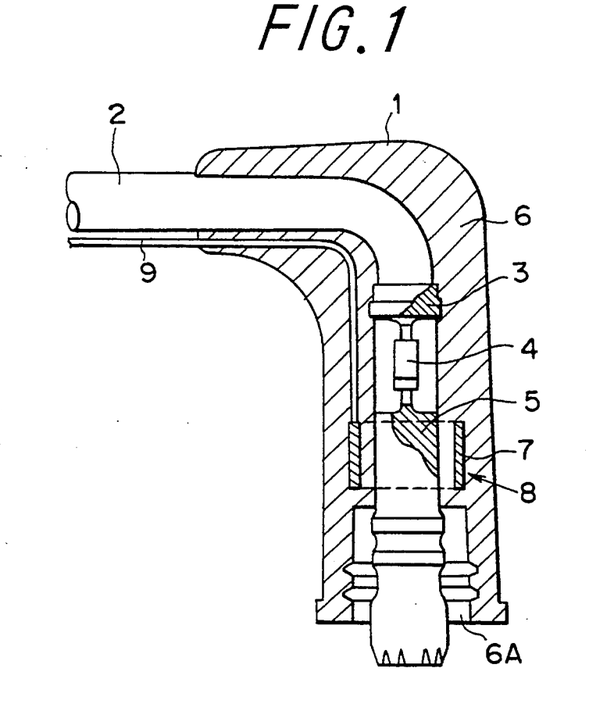
FIG. 1 is a sectional view of a high tension cord connector with a misfire detecting capacitor for a spark-ignition internal combustion engine according to a first embodiment of the invention.

FIG. 1 shows a high tension cord connector with a misfire detecting capacitor for an internal combustion engine according to the invention.

In the figure, reference numeral 1 designates a connector for a high tension cord (high-voltage cable) 2 with a conductive core (not shown) carrying an ignition voltage current from an ignition coil (not shown) to an ignition distributor (not shown). As illustrated, the high tension cord 2 is provided, at its distal end, with a metal tip 3, made of a good conductive material such as copper, which is connected with the aforesaid conductive core. The metal tip 3 is, via a diode 4 serving as current suppressing means, connected with a metallic connecting member 5 also made of a good conductive material such as copper and having a sufficient rigidity. The metallic connecting member is figured to be fitted with a mated connecting member such as an inlet connector of an ignition distributor (neither shown). A cover 6 is provided at the distal end of the cord to encompass the metal tip 3, the diode 4 and the metallic connecting member 5. The cover 6 is made of an insulation material such as EPDM (ethylene-propylene rubber), rubber such as silicone rubber or the like. (Any other material such as soft insulation resin may also be used for the cover.) The cover 6 is formed with, at its free end, a gripping portion 6A to be securely connected with a mated half provided at a device such as at an outlet connector of the ignition distributor so as to be held there in position. And, the diode 4 is provided for restrict the current flow direction so as to suppress or block reverse current flow as was earlier mentioned, i.e., to prevent current from flowing from a spark plug to an ignition coil.

Here, a conductor 7 for detection formed of a good conductive material such as copper or aluminum to have the shape of a hollow tube, a half tube(s) or a split tube(s) is disposed around the aforesaid metallic connecting member 5 keeping a predetermined distance therefrom. More specifically, the conductor 7 is embedded integrally in the cover 6 when the cover 6 is molded or fabricated such that it locates around the metallic connecting member 5 so as to encompass the same after the connector is completed. Thus, since the conductor 7 is integrally embedded in the cover 6 at the same time of molding or fabricating, a portion or part of the cover 6 is present between the inner surface of the conductor 7 and outer surface of the metallic connecting member 5. As a result, in the configuration shown in FIG. 1, the metallic connecting member 5 and the conductor 7 surrounding it constitute a detection capacitor 8 which has the intervening rubber (the part of the cover 6) as its dielectric. A lead 9 is connected with the conductor 7 for enabling voltage to be transmitted to the exterior of the connector.

Figure 2:
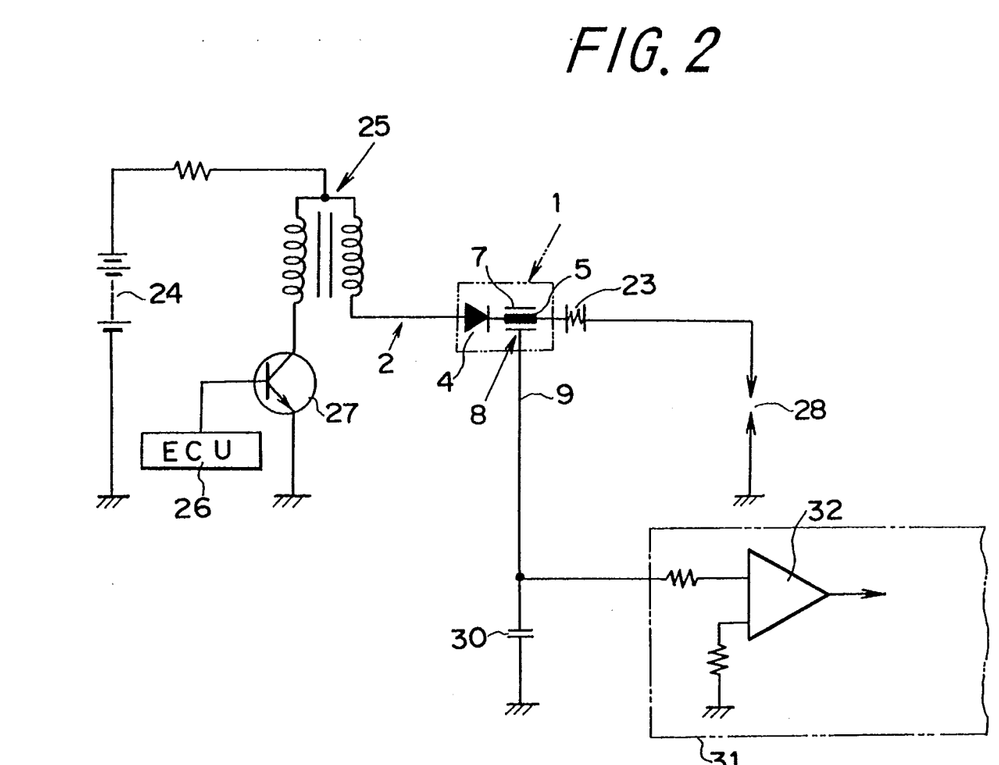
FIG. 2 is a wiring diagram showing the electrical circuitry of an ignition system utilizing the high tension cord connector of FIG. 1.

FIG. 2 is a schematic diagram showing the electric circuitry of an ignition system including the high tension cord connector 1 of FIG. 1.

In FIG. 2, current flowing from a battery 24 through the primary winding of the ignition coil 25 is turned on and off by a power transistor 27 in response to ignition signals from an engine control unit (ECU) 26. The high-voltage current induced in the secondary winding of the ignition coil 25 passes through the aforesaid high tension cord 2, the diode 4, the metallic connecting member 5, via an inlet of an ignition distributor 23 to an outlet thereof, to a spark plug 28 connected thereto. And the detection capacitor 8 is formed by providing the conductor 7 at the high tension cord connector as was explained earlier. The detection capacitor 8 is connected in series with a voltage divider capacitor 30 by the lead 9. The other terminal of the voltage divider capacitor 8 is grounded and an intermediate point (the voltage division point) between the detection capacitor 8 and the voltage divider capacitor 30 is connected with one terminal of an amplifier 32 on the input side of a misfire detector 31.

Here, a high voltage is produced on the secondary winding of the ignition coil 25 every time an ignition signal from the engine control unit 26 causes the power transistor 27 to switch from the on state to the off state and thus cut off the supply of current to the primary winding of the ignition coil 25. The current produced by this high voltage passes through the high tension cord 2, the diode 4 and the distributor 23 and then to the spark plug 28 where it produces a spark discharge between the terminals of the spark plug 28. The voltage of the current flowing through the metallic connecting member 5 at this time is capacitively divided by the capacitors 8, 30, and the capacitive-divided voltage is applied as a detection voltage to the misfire detector 31. The misfire detector 31 compares the wave form of the detection voltage with a reference wave form for discriminating the presence/absence of misfire.

Furthermore, as was explained earlier, when normal combustion does not occur and ions are therefore not produced at the gap between the electrodes of the spark plug 28, then, during the latter half of the discharge period, a current tends to be produced in the opposite direction from the direction of the normal discharge current. However, since this reverse current (tending to flow from the spark plug 28 toward the ignition coil 25) is suppressed by the diode 4, there is no possibility of the ignition voltage being canceled out by the reverse current. Thus, since there is no possibility of the wave form of the ignition voltage being disturbed by any such reverse current, accurate discrimination of the presence/absence of misfire is ensured at all times.

And, since the high tension cord connector can be firmly secured to any other device such as an inlet connector of an ignition distributor, the conductor 7 itself is free from being vibrated. Moreover, the conductor 7 is integrally embedded in the cover 6, any vibration it does receive will not shift the position of the conductor 7 or deform the same. In addition, since the conductor 7 is located in the cover 6, the conductor 7 is isolated from changes in humidity and other ambient conditions and is also safe from the invasion of oil, grime and the like from the outside.

Figure 3:
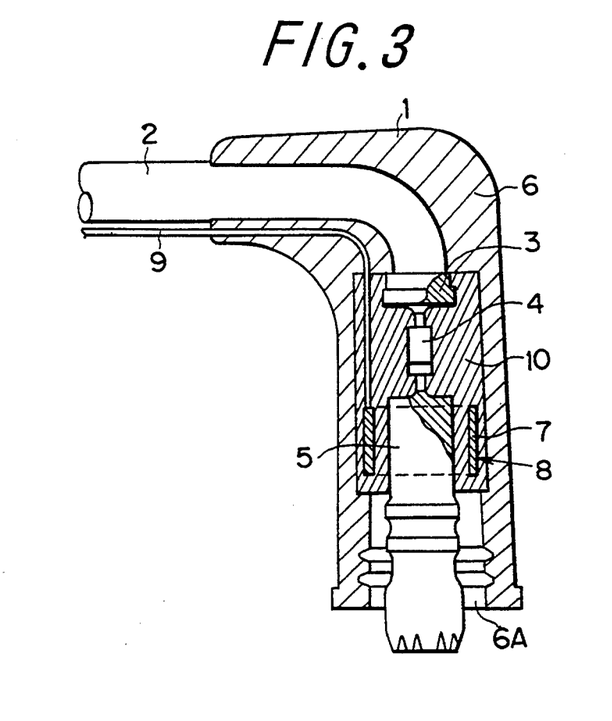
FIG. 3 is a sectional view of a high tension cord connector according to a second embodiment of the invention.

FIG. 3 shows a high tension cord connector according to a second embodiment of the invention. Components or elements in FIG. 3 and on which correspond to those in FIG. 1 are assigned identical reference numerals to their counterparts in FIG. 1 and will not be explained further.

In the configuration of the connector according to the second embodiment, the metal tip 3, the diode 4, the base of the metallic connecting member 5 and the conductor 7 or the like are integrally molded by a resin member 10 made of such as epoxy resin and embedded therein. The resin member 10 is, in turn, encompassed by the cover 6. The rests of the configuration are the same as those in the first embodiment. With the arrangement, in addition to the advantages obtained in the first embodiment, the work to attaching or affixing the cover 6 around the metallic connecting member 5 etc. are facilitated. And the metallic connecting member 5 etc. are made free from being damaged at that work.

Figure 4:
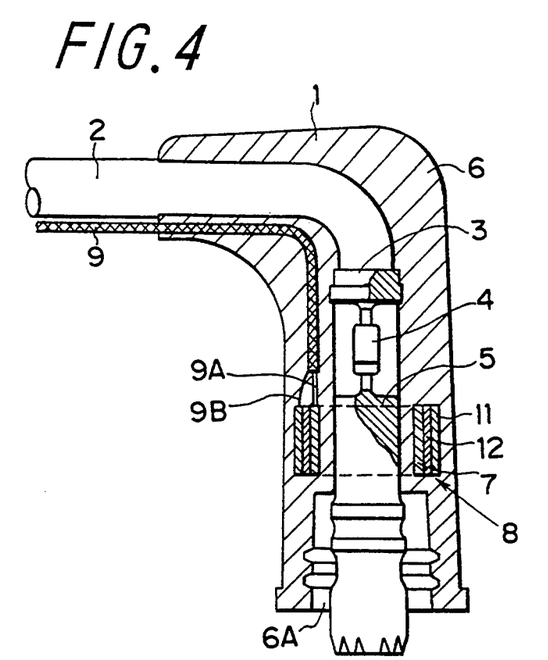
FIG. 4 is a sectional view of a high tension cord connector according to a third embodiment of the invention.

FIG. 4 shows a high tension cord connector according to a third embodiment of the invention, in which a shield member 11 is provided around the conductor 7.

The shield member 11 of FIG. 4 is fabricated from screen, net, foil or thin sheet of a good conductor material such as copper or aluminum and is disposed to be concentric with the conductor 7 at a fixed distance outward thereof. An insulation layer 12 is sandwiched between the conductor 7 and the shield member 11. The insulation layer 12 can be a resin material which also serves as a boding agent for bonding the shield member 11 to the outer surface of the conductor 7, or can be formed of the same type of the insulator cover 6. In addition, the shield member 11 may be embedded integrally in the resin at the time of molding or fabricating the cover. In order for the shield member 11 to exhibit a shield effect it has to be electrically grounded. Where a shielded wire is used for the aforementioned lead 9, as is normally the case, the grounding of the shield member 11 can be easily accomplished by connecting the conductive core 9A of the lead 9 to the conductor 7 and connecting the electrically grounded outer shield member 9B of the lead 9 to the shield member 11. In the third embodiment, since the shield member 11 is provided to surround the conductor 7 for detection. Therefore, even in a case where another conductive member is located near the high tension cord connector, there is little risk of the capacitance of the capacitor 8 for detection being caused to vary owing to changes in the distance between the connector and the conductive member, or to pick up noise from the conductive member.

Figure 5:
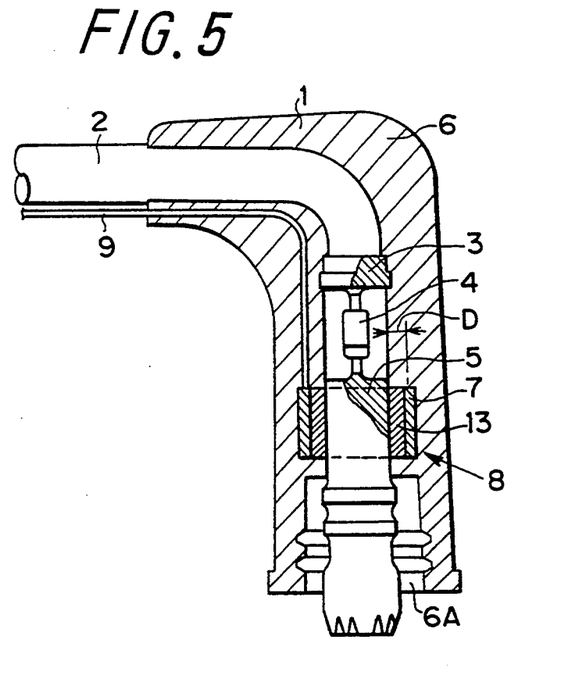
FIG. 5 is a sectional view of a high tension cord connector according to a fourth embodiment of the invention.

FIG. 5 shows a high tension cord connector according to a fourth embodiment of the invention.

The structure of the connector illustrated in FIG. 5 only differs from those shown in the foregoing embodiments in the feature that an insert or layer 13 made of ceramic exhibiting excellent insulation characteristics is disposed at the inner surface of the conductor 7. To be more specific, when such a ceramic insert or layer 13 is not provided at the inner side of the conductor 7 as was shown in FIG. 1, only a part or portion of the cover 6 is present between the metallic connecting member 5 and the conductor 7. On the other hand, when the ceramic insert or layer 13 is disposed there, the structure will show highly resistance against degradation of the insulation property caused such as by corona discharge and the insulation property against voltage will be enhanced, since the insulation characteristics of the ceramic is superior to the other materials. With the arrangement, therefore, it becomes possible to attain a sufficient static capacitance by reducing the distance D, shown in FIG. 5, thereby enhancing the accuracy of voltage wave form detection. In other words, the configuration illustrated in the figure can enhance the insulation characteristics to prevent a high leak voltage from being applied to the misfire detector through the conductor 7 and at the same time, can increase the static capacitance to a sufficient level so as to ensure the detection accuracy.

In the foregoing first to fourth embodiments, the conductor 7 is disposed outside the metallic connecting member 5. That is advantageous, because the static capacitance in the detection capacitor 8 becomes stable since the metallic connecting member 5 has a sufficient rigidity and hence undeformable.

Depending on the situation, however, it may be alternatively possible to dispose the conductor around the high tension cord 2 at its distal end. More specifically, the conductor 7 may be disposed immediately around the high tension cord's distal end, keeping a predetermined distance from the conductive core in the cord 2. At that instance, since the insulation cladding will necessarily be present between the conductive core and the conductor 7, the conductor 7 will therefore be exposed on the inner surface of the cover 6. Alternatively, the conductor 7 may be embedded in the cover 6 such that a part or portion of the cover 6 is present between the cord 2 and the conductor 7. In addition, the shield member 11 can be provided around the conductor 7 sandwiching the insulation layer 12. And the ceramic insert or layer 13 can also be provided around the inner surface of the conductor 7 similarly as the fourth embodiment. When the conductor 7 is disposed immediately around the high tension cord's distal end, the detection capacitor 8 will be formed between the cord's conductive core and the conductor 7. Even in such a case, it will be needless to explain that the ignition voltage wave form in the cord's conductive core will be able to be detected in a manner same as was explained.

Furthermore, in the foregoing first to fourth embodiments, although the high tension cord connector is explained to be connected with an inlet connector of an ignition distributor, it can also be connected with an outlet side thereof. Namely, the connector can be placed at any location between an ignition coil and an ignition distributor, or between an ignition distributor and a spark plug.

The present invention has thus been shown and described with reference to the specific embodiments. However, it should be noted that the present invention is in no way limited to the details of the described arrangements, changes and modification may be made without departing from the scope of the appended claims.

What is claimed is:

1. A connector disposed at a distal end of a high tension cord for an internal combustion engine, comprising;
   a first conductor comprising a conductive core of said high tension cord covered with an insulation cladding, said first conductor having, at a distal end, a tip;
   a current suppressor with a first and second end wherein said first end of said current suppressor is electrically connected to said tip;
   a conductive connecting member electrically connected to said second end of the current suppressor;
   a connector cover comprising an insulation material disposed around a portion of said first conductor, said current suppressor and a portion of said connecting member; and
   a second conductor provided at said connector cover in such a manner that it is located around said conductive connecting member and is disposed a predetermined distance therefrom such that a capacitor is formed.

2. A connector according to claim 1, wherein said cover has a connecting portion to be firmly secured with a mated connecting portion of a device so as to be held in position.

3. A connector according to claim 1, wherein said first end of the current suppressor is electrically connected to said conductive core of said high tension cord through said tip, and said second conductor is embedded in said cover in such a manner that it is located around the conductive connecting member keeping said predetermined distance therefrom and sandwiching at least a portion of said connector cover.

4. A connector according to claim 1, wherein said second conductor is a metal tube encircling said conductive connecting member.

5. A connector according to claim 1, wherein said second conductor is metal tube segments encircling said conductive connecting member.

6. A connector according to claim 1, wherein a ceramic insulator is provided between said conductive connecting member.

7. A connector according to claim 1, wherein said second conductor is electrically shielded.

8. A connector according to claim 6, wherein said second conductor is electrically shielded.

9. A connector disposed at a distal end of a high tension cord for an internal combustion engine, comprising;
   a first conductor comprising a conductive core of said high tension cord covered with an insulation cladding, said first conductor having, at a distal end, a tip;
   a means for preventing current from flowing in said first conductor from a spark plug with a first and second end wherein said first end of said current suppressor is electrically connected to said tip;
   a conductive connecting member electrically connected to said second end of said means for preventing current;
   a connector cover comprising an insulation material disposed around a portion of said first conductor, said means for preventing current and a portion of said conductive connecting member; and
   a second conductor provided at said connector cover in such a manner that it is located around said conductive connecting member and is disposed a predetermined distance therefrom such that a capacitor is formed.

10. A connector according to claim 9, wherein said means for preventing current is a diode.

11. A connector according to claim 10, wherein said first conductor has said conductive connecting member electrically connected to said conductive core of said high tension cord and said diode is provided between said conductive core and said conductive connecting member.

12. A connector disposed at a distal end of a high tension cord for an internal combustion engine, comprising:
- a first conductor made up of a conductive core of said high tension cord covered with an insulation cladding, said first conductor having, at the distal end, a tip;
- a current suppressor with a first and second end wherein said first end of said current suppressor is electrically connected to said tip;
- a conductive connecting member electrically connected to said second end of said current suppressor;
- a connector cover made of an insulation material and disposed around a portion of said first conductor, said current suppressor and a portion of said conductive connecting member;
- a resin member provided between said connector cover and said first conductor for securing at least said conductive connecting member in position; and
- a second conductor embedded in said resin in such a manner that it locates around said conductive connecting member keeping a predetermined distance therefrom and sandwiching at least a portion of said resin member such that a capacitor is formed.

13. A connector according to claim 12, wherein said cover has a connecting portion to be firmly secured with a mated connecting portion of a device so as to be held in position.

14. A connector according to claim 12, wherein said second conductor is a metal tube encircling said first conductor.

15. A connector according to claim 12, wherein said second conductor is metal tube segments encircling said first conductor.

16. A connector according to claim 12, wherein said second conductor is electrically shielded.

17. A connector according to claim 12, wherein a ceramic insulator is provided between said conductive connecting member and said second conductor.

18. A connector according to claim 17, wherein said second conductor is electrically shielded.

19. A connector disposed at a distal end of a high tension cord for an internal combustion engine, comprising:
- a first conductor made up of a conductive core of said high tension cord covered with an insulation cladding, said first conductor having, at distal end, a tip;
- a means for preventing current from flowing in said first conductor from a spark plug with a first and second end wherein said first end of said means for preventing current from flowing is electrically connected to said tip;
- a conductive connecting member electrically connected to said second end of said means for preventing current from flowing;
- a connector cover made of an insulation material and disposed around a portion of said first conductor, said means for preventing current from flowing and a portion of said conductive connecting member of said first conductor;
- a resin member provided between said connector cover and said first conductor for securing at least said conductive connecting member in position; and
- a second conductor embedded in said resin in such a manner that it locates around the conductive connecting member keeping a predetermined distance therefrom and sandwiching at least a portion of said resin member such that a capacitor is formed.

20. A connector according to claim 19, wherein said means for preventing current from flowing is a diode.

21. A connector according to claim 20, wherein said first conductor has said conductive connecting member eclectically connected to said conductive core of said high tension cord and said diode is provided between said conductive core and conductive connecting member.

* * * * *

UNITED STATES PATENT AND TRADEMARK OFFICE
CERTIFICATE OF CORRECTION

PATENT NO. : 5,438,970
DATED : August 8, 1995
INVENTOR(S) : Maruyama et al.

It is certified that error appears in the above-indentified patent and that said Letters Patent is hereby corrected as shown below:

Column 10, line 11, delete "at distal" insert therefor -- at a distal --

Signed and Sealed this

Thirteenth Day of May, 1997

Attest:

Attesting Officer

BRUCE LEHMAN

Commissioner of Patents and Trademarks